(12) United States Patent
Sato et al.

(10) Patent No.: US 8,258,527 B2
(45) Date of Patent: Sep. 4, 2012

(54) LIGHTING DEVICE AND SEMICONDUCTOR LIGHT SOURCE DEVICE

(75) Inventors: Masanori Sato, Tokyo (JP); Takashi Ebisutani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 187 days.

(21) Appl. No.: 12/481,537

(22) Filed: Jun. 9, 2009

(65) Prior Publication Data

US 2009/0302343 A1 Dec. 10, 2009

(30) Foreign Application Priority Data

Jun. 9, 2008 (JP) ................................ 2008-150878

(51) Int. Cl.
 *H01L 33/00* (2010.01)
(52) U.S. Cl. .................................. 257/98; 257/E33.068
(58) Field of Classification Search .................. 257/98, 257/E33.068
 See application file for complete search history.

(56) References Cited

U.S. PATENT DOCUMENTS

| | | |
|---|---|---|
| 3,876,900 A | 4/1975 | Amatsuka et al. |
| 6,038,387 A | 3/2000 | Machida |
| 6,066,861 A | 5/2000 | Hohn et al. |
| 6,245,259 B1 | 6/2001 | Hohn et al. |
| 6,277,301 B1 | 8/2001 | Hohn et al. |
| 6,396,082 B1 * | 5/2002 | Fukasawa et al. ............... 257/79 |
| 6,441,943 B1 | 8/2002 | Roberts et al. |
| 6,565,247 B2 | 5/2003 | Thominet |
| 6,576,930 B2 | 6/2003 | Reeh et al. |
| 6,592,780 B2 | 7/2003 | Hohn et al. |
| 6,613,247 B1 | 9/2003 | Hohn et al. |
| 6,639,360 B2 | 10/2003 | Roberts et al. |
| 6,669,866 B1 | 12/2003 | Kummer et al. |
| 6,774,401 B2 | 8/2004 | Nakada et al. |
| 6,809,342 B2 | 10/2004 | Harada |
| 6,812,500 B2 | 11/2004 | Reeh et al. |
| 6,827,473 B2 | 12/2004 | Kobayashi |
| 6,835,960 B2 * | 12/2004 | Lin et al. ......................... 257/81 |
| 6,850,001 B2 | 2/2005 | Takekuma |
| 6,855,958 B2 | 2/2005 | Sato et al. |
| 6,948,836 B2 | 9/2005 | Ishida et al. |
| 6,987,613 B2 * | 1/2006 | Pocius et al. .................. 359/565 |
| 2001/0019486 A1 | 9/2001 | Thominet |
| 2002/0185966 A1 | 12/2002 | Murano |
| 2003/0230757 A1 | 12/2003 | Suehiro et al. |
| 2004/0008516 A1 | 1/2004 | Amano |
| 2004/0027067 A1 * | 2/2004 | Song et al. ..................... 313/512 |

(Continued)

FOREIGN PATENT DOCUMENTS

DE 20206833 8/2002

(Continued)

*Primary Examiner* — Thien F Tran
(74) *Attorney, Agent, or Firm* — Kenealy Vaidya LLP

(57) ABSTRACT

A small-sized lighting device can achieve wider light distribution patterns. The lighting device can include a semiconductor light emitting element configured to emit light from a first face and a second face thereof. A mounting substrate can be provided on which the semiconductor light emitting element is mounted. Light emitted from the second face can transmit through the mounting substrate, and a first optical system can be provided and configured to impart a first light distribution pattern to the light emitted from the first face of the semiconductor light emitting element. A second optical system can be provided and configured to impart a second light distribution pattern to light emitted from the second face of the semiconductor light emitting element.

1 Claim, 10 Drawing Sheets

U.S. PATENT DOCUMENTS

| | | |
|---|---|---|
| 2004/0090790 A1 | 5/2004 | Ishida et al. |
| 2004/0130907 A1 | 7/2004 | Albou |
| 2004/0136197 A1 | 7/2004 | Ishida |
| 2004/0136202 A1 | 7/2004 | Ishida et al. |
| 2004/0160772 A1 | 8/2004 | Tatsukawa et al. |
| 2004/0160783 A1 | 8/2004 | Tatsukawa et al. |
| 2004/0196663 A1 | 10/2004 | Ishida et al. |
| 2004/0223338 A1 | 11/2004 | Koike et al. |
| 2004/0251469 A1 | 12/2004 | Yatsuda et al. |
| 2004/0257827 A1 | 12/2004 | Ishida et al. |
| 2005/0018446 A1 | 1/2005 | Ishida |
| 2005/0041434 A1 | 2/2005 | Yatsuda et al. |
| 2005/0052878 A1 | 3/2005 | Yamada et al. |
| 2005/0088853 A1 | 4/2005 | Yatsuda et al. |
| 2006/0120081 A1 | 6/2006 | Yatsuda et al. |
| 2007/0263404 A1 | 11/2007 | Yatsuda et al. |
| 2010/0103650 A1* | 4/2010 | Herrmann et al. ............ 362/97.1 |

FOREIGN PATENT DOCUMENTS

| | | |
|---|---|---|
| EP | 1081771 | 3/2001 |
| EP | 1447616 | 8/2004 |
| EP | 1447617 | 8/2004 |
| GB | 2400166 | 10/2004 |
| GB | 2402203 | 12/2004 |
| JP | 59124179 | 7/1984 |
| JP | 1120702 | 5/1989 |
| JP | 05226691 | 9/1993 |
| JP | 06202242 | 7/1994 |
| JP | 10190065 | 7/1998 |
| JP | 10256607 | 9/1998 |
| JP | 11087782 | 3/1999 |
| JP | 2000150968 | 5/2000 |
| JP | 2001127346 | 5/2001 |
| JP | 2001196639 | 7/2001 |
| JP | 2001210872 | 8/2001 |
| JP | 2001345483 | 12/2001 |
| JP | 2002094127 | 3/2002 |
| JP | 2002289926 | 10/2002 |
| JP | 2003031011 | 1/2003 |
| JP | 2004056075 | 2/2004 |
| JP | 2004063499 | 2/2004 |
| JP | 2005-129404 | 5/2005 |
| WO | WO03071352 | 8/2003 |

* cited by examiner

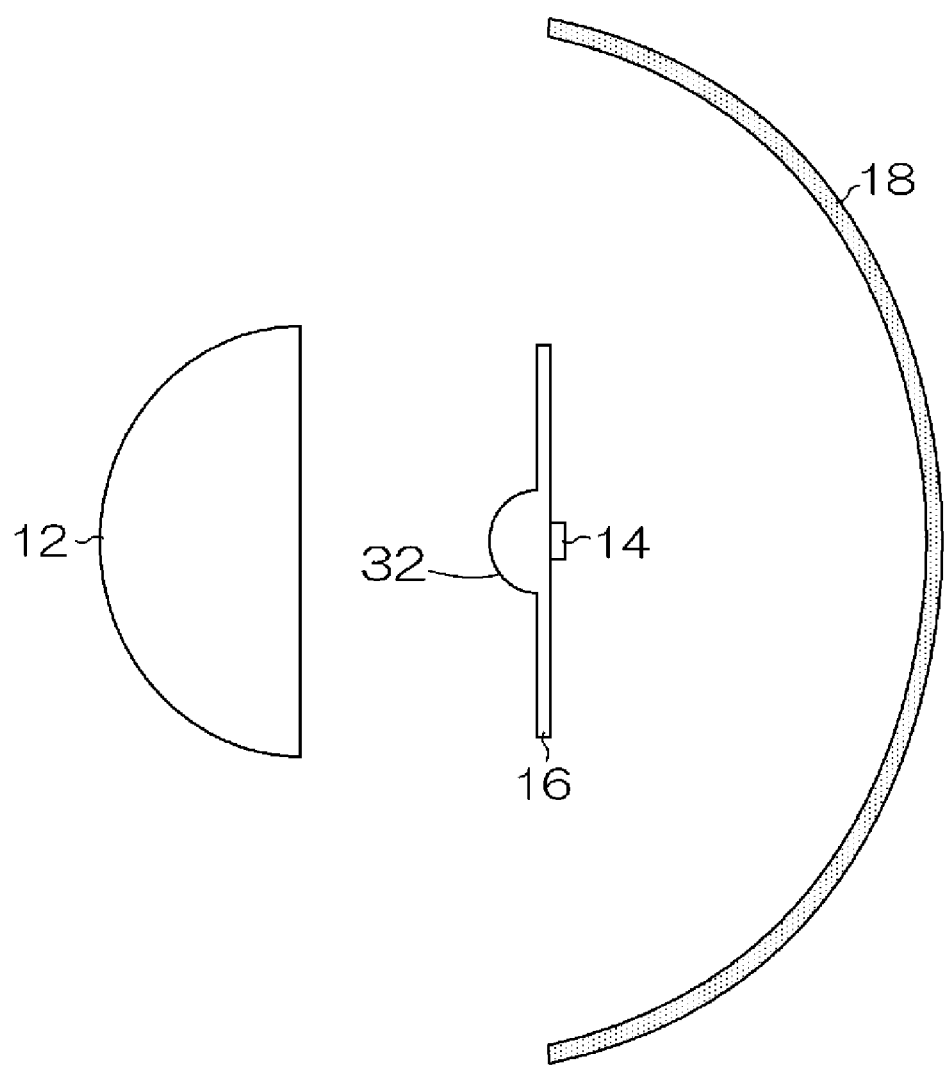

LIGHTING DEVICE AND SEMICONDUCTOR LIGHT SOURCE DEVICE

This application claims the priority benefit under 35 U.S.C. §119 of Japanese Patent Application No. 2008-150878 filed on Jun. 9, 2008, which is hereby incorporated in its entirety by reference.

TECHNICAL FIELD

The presently disclosed subject matter relates to a lighting device and a semiconductor light source device for use in such a lighting device, and in particular, to a lighting device and a semiconductor light source device utilizing a semiconductor light emitting element as a light source.

BACKGROUND ART

A conventional lighting device for forming a desired light distribution pattern has been known which utilizes a plurality of semiconductor light emitting elements such as LED devices.

One example of such conventional lighting devices is disclosed in Japanese Patent Application Laid-Open No. 2005-129404, for example. The lighting device includes a plurality of light source modules each including an LED device as a light source, and optical systems each configured to project light emitted from each of the light source modules onto each different area within a predetermined light distribution pattern in a forward direction.

SUMMARY

The disclosed lighting device of this type typically has a plurality of light source modules and a corresponding number of optical systems module by module in order to provide a light distribution pattern required for such a lighting device. One set that includes the light source module and the optical system can form a particular light distribution pattern that is different from another set. The thus obtained different particular light distribution patterns from these optical systems are superimposed over the others to form the desired light distribution pattern.

Accordingly, the conventional lighting device may have a large size as a whole because of the plurality of light source modules required, resulting in increased cost and space requirements. Furthermore, a semiconductor light source device that can provide a wider light distribution pattern with fewer light source modules is still demanded.

The presently disclosed subject matter was devised in view of these and other problems, characteristics, and in association with the conventional art. According to an aspect of the presently disclosed subject matter a lighting device can be configured to provide a wider light distribution pattern and can be miniaturized with ease.

It is another aspect of the presently disclosed subject matter to provide a semiconductor light source device which can provide a wider light distribution pattern with fewer light source modules.

According to another aspect of the presently disclosed subject matter, a lighting device can include: a semiconductor light emitting element having a first face and a second face on an opposite side of the first face, the semiconductor light emitting element configured to emit light from the first face and the second face; a mounting substrate on which the semiconductor light emitting element is mounted, the light emitted from the second face being transmitted through the mounting substrate; a first optical system configured to impart a first light distribution pattern to the light emitted from the first face of the semiconductor light emitting element; and a second optical system configured to impart a second light distribution pattern to the light emitted from the second face of the semiconductor light emitting element.

The lighting device according to the presently disclosed subject matter can include the optical systems that can impart different light distribution patterns to the light emitted from the first face and that from the second face, respectively. Accordingly, even with a single semiconductor light emitting element being used, a wider light distribution pattern can be achieved. In particular, the lighting device according to the presently disclosed subject matter can simultaneously form both a focused light distribution pattern for providing a high intensity of light where required and a diffused light distribution pattern for providing a moderate intensity of light with a single semiconductor light emitting element. This can also achieve miniaturization of the entire lighting device.

In the lighting device according to the presently disclosed subject matter, the mounting substrate can be configured to have a transparent portion or a through hole at an area where the semiconductor light emitting element is to be mounted.

When the mounting substrate has such a transparent portion or a through hole, at least partly, at the area where the semiconductor light emitting element is to be mounted, the light emitted from the second face of the semiconductor light emitting element can transmit through the mounting substrate without any obstacles. If the mounting substrate employs such a transparent portion, the portion can be 80% or more in transmittance, and possibly, 90% or more with regard to the light emitted from the second face of the semiconductor light emitting element.

In the lighting device according to the presently disclosed subject matter, the transparent portion or the through hole of the mounting substrate can have a smaller area than that of the face of the semiconductor light emitting element to be mounted.

When the transparent portion or the through hole has a smaller area than the to-be-mounted face of the semiconductor light emitting element, the light emitted from the second face (or the first face when the first face is to be mounted) can be provided with a predetermined shape. This can easily form a desired light distribution pattern with such a predetermined shape of light which is different from the light distribution pattern of light emitted from the other face of the semiconductor light emitting element. This means that a single semiconductor light emitting element can achieve different light distribution patterns simultaneously and easily. In particular, this lighting device can be advantageously employed for a vehicle light which can easily form a cutoff line in a low-beam light distribution pattern. Simultaneously, the lighting device can provide a wider light distribution pattern different from the light distribution pattern with the cutoff line.

In a lighting device according to the presently disclosed subject matter, the semiconductor light emitting element can have side faces connecting the first and second faces, the side faces being provided with a reflection film or a white member with high reflectivity.

The provision of such a reflection film or a white member with high reflectivity to the side faces of the semiconductor light emitting element can prevent light from leaking from the side faces. Almost all of the light generated by the semiconductor light emitting element can be guided by any of the first and second faces to be projected toward the first optical system and the second optical system. Accordingly, light loss can be suppressed, thereby achieving a lighting device with high efficiency.

A lighting device according to the presently disclosed subject matter can further include an optical member configured to control light emitted from the second face of the semiconductor light emitting element, the optical member being disposed on, or adjacent, the opposite side of the mounting substrate to the side where the semiconductor light emitting element is disposed.

The optical member can control the light emitted from the second face of the semiconductor light emitting element so that light from the first optical system and light from the second optical system are controlled so as not to overlap with each other (or at least not substantially overlap). This can also ensure that the light emitted from the second face of the semiconductor light emitting element enters the second optical system.

In this case, the optical member can be configured to shield and/or reflect light in a predetermined direction at least in part so as to guide the light toward the second optical system. Furthermore, the optical system can be configured to shield and/or reflect light in a light path toward the first optical system at least in part so as to guide the light emitted from the second face, not toward the first optical system, but toward the second optical system.

A lighting device according to the presently disclosed subject matter can further include a reflection plate disposed on, or adjacent, the opposite side of the mounting substrate to the side so that the reflection plate is parallel to an optical axis of the semiconductor light emitting element.

The reflection plate can reflect light emitting from the second face of the semiconductor light emitting element in a predetermined direction and also can reduce the size of the second optical system, resulting in the reduction of the entire size of the lighting device.

The above-described lighting device according to the presently disclosed subject matter can further include a wavelength-conversion layer provided directly or indirectly to the first face and/or the second face of the semiconductor light emitting element.

The wavelength conversion layer can wavelength-convert light emitted from the semiconductor light emitting element to light that is appropriately colored. By doing so, light with an appropriate color temperature, chromaticity or the like optical characteristics required or desired for such a lighting device can be achieved. In this instance, the wavelength-conversion layer can be disposed directly on each of the first face and the second face of the semiconductor light emitting element. If the wavelength-conversion layer is directly disposed on the first and second faces, the entire size increase of the light source can be suppressed.

Alternatively, a lighting device according to the presently disclosed subject matter can further include a wavelength-conversion layer provided on one of a face of the mounting substrate where the semiconductor light emitting element is mounted and a face thereof opposite to the face where the semiconductor light emitting element is mounted, or disposed within the through hole formed in the mounting substrate.

By doing so, the wavelength-conversion layer can be freely disposed in accordance with the semiconductor light emitting element to be mounted in various ways.

In the above-described lighting device, the wavelength-conversion layer provided to the first face and/or the second face of the semiconductor light emitting element can wavelength-convert the light emitted from the first face and/or the second face so as to emit various white light with different color temperatures or chromaticity.

When the wavelength-conversion layer provided to the first face and/or the second face is appropriately adjusted, the (pseudo) white light emitted from the first face and/or the second face and transmitted through the wavelength-conversion layer can be provided with various different color temperature, chromaticity, or the like optical characteristics. Accordingly, the light distribution pattern formed by synthesizing the light from the first optical system and the second optical system can be composed of light distribution patterns with different color temperature, chromaticity, or the like optical characteristics.

The lighting device can further include a light-shielding member disposed on, or adjacent, the first face of the semiconductor light emitting element.

The light-shielding member can be configured to impart a predetermined light distribution pattern to the light emitted from the first face of the semiconductor light emitting element.

In particular, the light-shielding member can be configured to impart a predetermined low-beam light distribution pattern to the light emitted from the first face of the semiconductor light emitting element.

When the light-shielding member is shaped to have a pattern corresponding to the low-beam light distribution pattern, it is easy to form a required predetermined low-beam light distribution pattern.

A lighting device according to the presently disclosed subject matter can further include a movable shutter near the mounting substrate to allow the light distribution pattern to be variable.

In a concrete exemplary embodiment of the lighting device according to the presently disclosed subject, the optical axes of the first and second faces of the semiconductor light emitting elements can be aligned with the illumination direction of the lighting device. One of the first optical system and the second optical system can include a projection lens configured to allow the light from the corresponding one of the first face and the second face to enter. The other of the first optical system and the second optical system can include a reflector configured to reflect light from the corresponding one of the first face and the second face in the illumination direction.

Alternatively, in another concrete exemplary embodiment of the lighting device according to the presently disclosed subject, the optical axes of the first and second faces of the semiconductor light emitting elements can be aligned perpendicular to the illumination direction of the lighting device. The first optical system can include a reflector configured to reflect light emitted from the first face and a projection lens configured to allow the light reflected by the reflector to enter. The second optical system can include a reflector configured to reflect the light emitted from the second face in the illumination direction.

According to still another aspect of the presently disclosed subject matter, a semiconductor light source device can include: a semiconductor light emitting element having a first face and a second face on an opposite side of the first face, the semiconductor light emitting element being capable of emitting light from the first face and the second face; a mounting substrate configured to allow the semiconductor light emitting element to be mounted thereon, the light emitted from the second face being transmitted through the mounting substrate; and wavelength-conversion layers provided to the first face and the second face of the semiconductor light emitting element.

When the wavelength-conversion layers are disposed on the first face and the second face of the semiconductor light emitting element as in the presently described semiconductor light source device, the configuration of the lighting device can impart required or desired light distribution patterns to the light from the first face and the light from the second face utilizing the optical systems.

In an exemplary embodiment of the semiconductor light source device, the mounting substrate can have a through hole at an area where the semiconductor light emitting element is mounted, and the wavelength-conversion layer can be disposed within the through hole on the second face side.

When the wavelength-conversion layer is disposed within the through hole of the mounting substrate, the mounting substrate can function as a light shielding member. This configuration can shape the light emitted from the second face to have a similar or corresponding shape to the through hole.

The lighting device according to the presently disclosed subject matter can be configured to provide a relatively wide light distribution pattern with relatively small size. The semiconductor light source device according to the presently disclosed subject matter can be configured to provide a wider light distribution pattern with fewer light source modules.

BRIEF DESCRIPTION OF DRAWINGS

These and other characteristics, features, and advantages of the presently disclosed subject matter will become clear from the following description with reference to the accompanying drawings, wherein:

FIG. 12 is a schematic view illustrating a modified example of the sixth exemplary embodiment;

DETAILED DESCRIPTION OF EXEMPLARY EMBODIMENTS

A description will now be made below to lighting devices of the presently disclosed subject matter with reference to the accompanying drawings in accordance with exemplary embodiments

First Exemplary Embodiment

Figure 1:
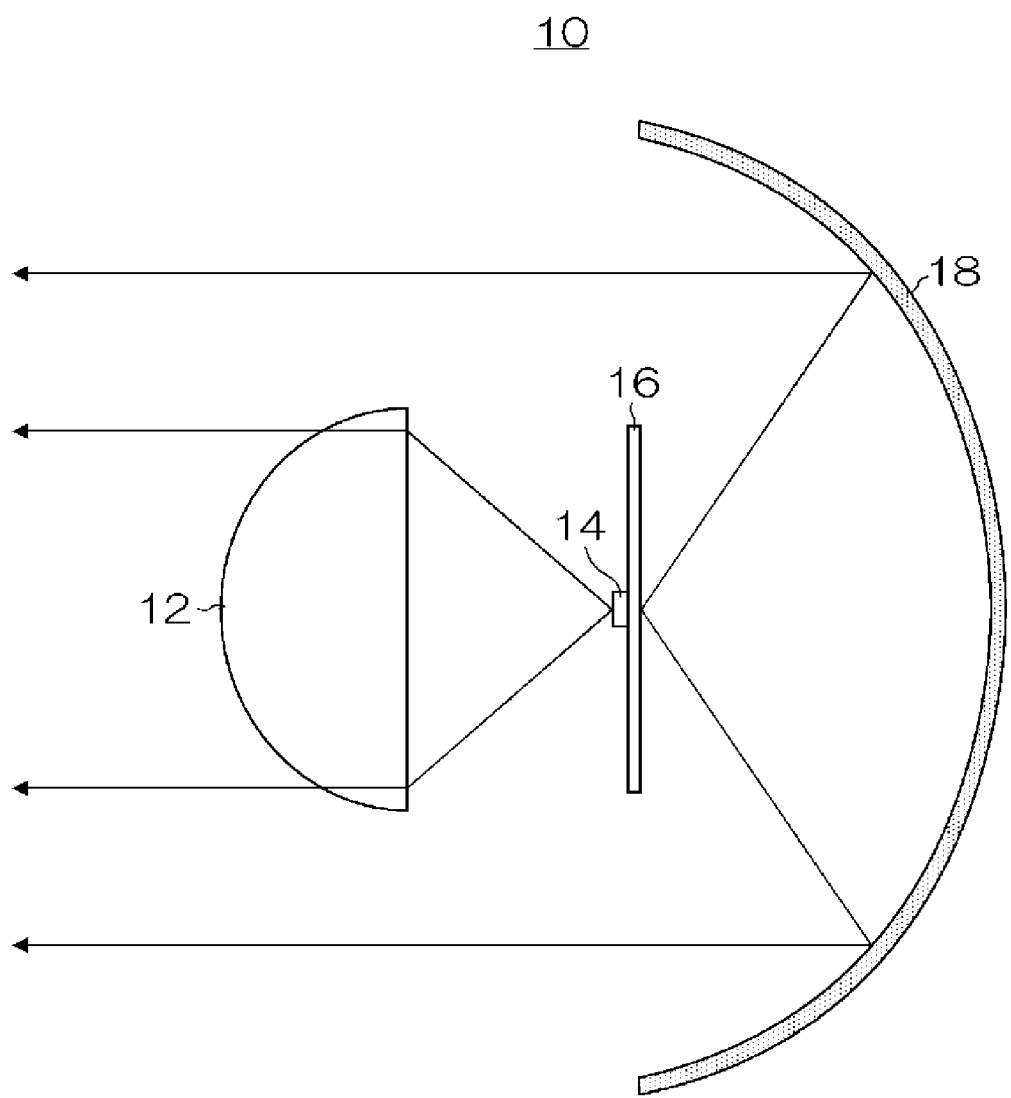
FIG. 1 is a schematic view illustrating a first exemplary embodiment of a lighting device made in accordance with principles of the presently disclosed subject matter.

FIG. 1 is a schematic cross-sectional view illustrating a basic structure of a lighting device made in accordance with principles of the presently disclosed subject matter. The lighting device 10 of FIG. 1 can include: a semiconductor light emitting element 14 having a first face and a second face on an opposite side of the first face, a mounting substrate 16 configured to allow the semiconductor light emitting element 14 to be mounted thereon, a projection lens 12 disposed at a position where the lens 12 can receive the light emitted from the first face of the semiconductor light emitting element 14, and a reflector 18 disposed on the opposite side of the mounting substrate from the side where the semiconductor light emitting element is disposed. The reflector 18 can be configured to receive light emitted from the second face of the semiconductor light emitting element 14.

The semiconductor light emitting element 14 can have the first face and the second face on an opposite side of the first face. The light generated by the semiconductor light emitting element 14 can be emitted from at least both the first face and the second face. In the present exemplary embodiment, the semiconductor light emitting element 14 can be mounted on the mounting substrate 16 so that the second face of the light emitting element 14 is brought into contact with a first face of the mounting substrate 16. The mounting substrate 16 can be entirely transparent or can have a transparent portion or a partial or total through hole in order to allow light emitted from the second face of the semiconductor light emitting element 14 to transmit through the mounting substrate 16 to a second face of the substrate 16 without substantial obstacles.

In this instance, the second face of the semiconductor light emitting element 14 means the light emission surface of the semiconductor light emitting element 14 facing towards the mounting substrate 16 and the face on the opposite side of the first face of the semiconductor light emitting element 14.

In the presently disclosed subject matter, the semiconductor light emitting element 14 can emit any color of light. For example, when white light should be emitted, the semiconductor light emitting element 14 can include a wavelength-conversion layer, and a light emission layer configured to emit blue light, thereby generating white light by additive color mixture. In an alternative way, a combination of a GaN type semiconductor light emitting element that can emit blue or near-ultraviolet light and a wavelength-conversion layer containing YAG, or a phosphor in a resin or ceramic can be used. The structures of the semiconductor light emitting element 14, the mounting substrate 16, and the wavelength-conversion layer will be described in detail later.

In the present exemplary embodiment, the projection lens 12 can function as the first optical system. The projection lens 12 can be a convex lens having a planar light receiving surface and a convex light emitting surface.

The projection lens 12 can be disposed so that the optical axis thereof coincides with the center axis (or optical axis) of the semiconductor light emitting element 14. The projection lens 12 can have a focus on the light source side so that the focus is disposed on or near the first face of the semiconductor light emitting element 14. Accordingly, the light emitted from the first face of the semiconductor light emitting element 14 can be focused and projected by the projection lens 12 serving as the first optical system in a desired direction to form a predetermined first light distribution pattern.

In the presently disclosed subject matter, the reflector 18 can function as the second optical system. The reflector 18 can be composed of a concave revolved parabolic surface or elliptic surface, for example. The reflector 18 can be disposed with regard to the center axis (or optical axis) of the semiconductor light emitting element 14. The reflector 18 can have a focus that is disposed on or near the second face of the semiconductor light emitting element 14. The light can be emitted from the second face of the semiconductor light emitting element 14 in a desired direction while reflected by the second optical system to form a desired second light distribution pattern. The second light distribution pattern provided by the second optical system can have a different shape from that of the first light distribution pattern provided by the first optical system.

Herein, the first optical system should refer to an optical system that can receive light emitted from the first face of the semiconductor light emitting element 14 to impart a particular light distribution pattern to that light. Furthermore, the second optical system should refer to an optical system that can receive light emitted from the second face of the semiconductor light emitting element 14 to impart another particular light distribution pattern to that light.

When the lighting device 10 is applied to a vehicle lamp, such as a vehicle headlight, the light emitted from the first face of the semiconductor light emitting element 14 can be adjusted to have the first light distribution pattern by the projection lens 12 serving as the first optical system, thereby being projected in the forward illumination direction of the vehicle. It should be noted that the first light distribution pattern can constitute a part of a light distribution pattern required for a vehicle headlight.

The light emitted from the second face of the semiconductor light emitting element 14 can be adjusted to have the second light distribution pattern by the reflector 18 serving as the second optical system, thereby being projected in the forward illumination direction of the vehicle. It should be noted that the second light distribution pattern can also constitute a part of the light distribution pattern required for the vehicle headlight.

For example, the first light distribution pattern can constitute a focused light distribution pattern for providing a high intensity of light where required, and the second light distribution pattern can constitute a diffused light distribution pattern for providing a moderate intensity of light.

A description will now be given of structures of several semiconductor light source devices including a semiconductor light emitting element 14 and a mounting substrate 16, which are used for the lighting device 10 of the presently disclosed subject matter, with reference to FIGS. 2A to 2D.

Figure 2A:
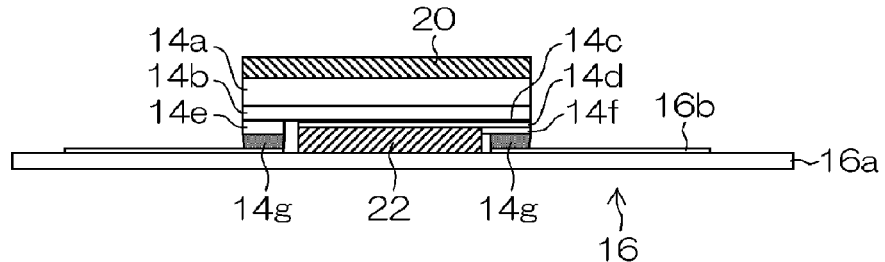
FIGS. 2A, 2B, and 2C are cross-sectional views schematically illustrating a semiconductor light source device made in accordance with principles of the presently disclosed subject matter.
Figure 2B:
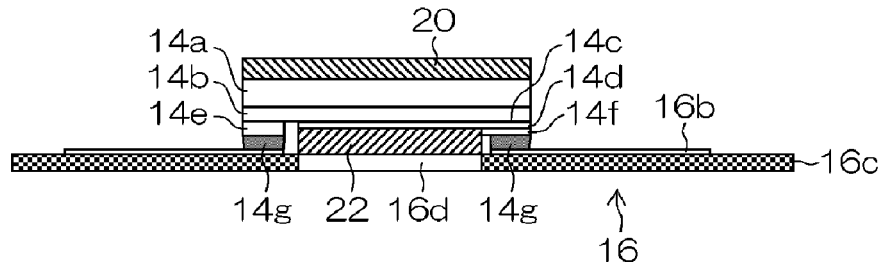
Figure 2C:
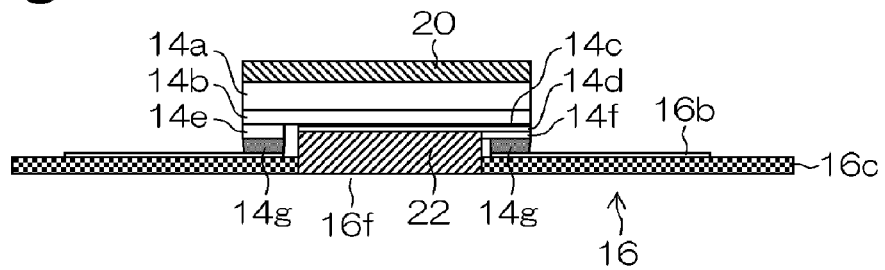
Figure 2D:
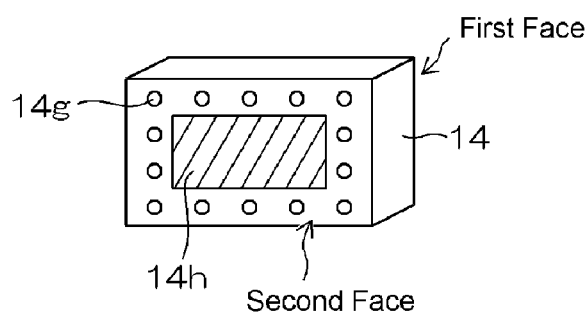
FIG. 2D is a perspective view of another semiconductor light source device when viewed from its bottom side.

FIGS. 2A, 2B, and 2C are cross-sectional views each schematically illustrating a semiconductor light source device including a semiconductor light emitting element, a mounting substrate, and wavelength-conversion layers. In particular, FIG. 2A shows a semiconductor light source device employing a transparent mounting substrate, FIG. 2B shows a semiconductor light source device employing a mounting substrate having a transparent portion in part, and FIG. 2C shows a semiconductor light source device employing an opaque mounting substrate having a through hole formed therethrough.

As shown in FIG. 2A, the semiconductor light emitting element 14 can be an LED element including a transparent support substrate (e.g., a sapphire substrate) 14a, an n-GaN layer 14b, a light emitting layer 14c, and a p-GaN layer 14d, stacked on the sapphire substrate 14a by an epitaxial growth method.

Parts of the light emitting layer 14c and the p-GaN layer 14d are removed by etching so that the n-GaN layer 14b is partly exposed. Then, an n-electrode 14e is formed on the exposed n-GaN layer 14b while a p-electrode 14f is formed on the p-GaN layer 14d. Accordingly, in the present exemplary embodiment, the n-electrode 14e and the p-electrode 14f are formed on the same surface of the semiconductor light emitting element 14.

The presently disclosed subject matter can employ various other semiconductor light emitting elements other than the semiconductor light emitting element 14 of the present exemplary embodiment including the n-GaN layer 14b, the light emitting layer 14c, and the p-GaN layer 14d stacked on the sapphire substrate 14a. For example, the presently disclosed subject matter can employ a semiconductor light emitting element further including another layer or a light emitting layer having a quantum well structure. It should be noted that, when the semiconductor light emitting element 14 is composed of a GaN-type compound semiconductor material, the resulting semiconductor light emitting element 14 can emit, for example, ultraviolet light, near-ultraviolet light, blue light, green light, or the like.

The mounting substrate 16 on which the semiconductor light emitting element 14 is mounted can include a transparent substrate 16a such as a glass substrate and wiring 16b formed on the transparent substrate 16a. As shown in FIG. 2A, the mounting substrate 16 can be composed entirely of a transparent substrate. If the mounting substrate employs such a transparent substrate or transparent part, the transmittance thereof can be 80% or more, and possibly, 90% or more with regard to the light emitted from the second face of the semiconductor light emitting element 14. The semiconductor light emitting element 14 can be electrically connected to the wiring 16b on the transparent substrate 16a by use of bumps 14g. The bumps 14g do not cover the entire second face of the semiconductor light emitting element 14 (lower face of the element in the drawing), thereby achieving the light emission from the second face without any substantial obstacles. Accordingly, the light emitted from the second face of the semiconductor light emitting element 14 can transmit through the mounting substrate 16 so as to enter the second optical system.

In the present exemplary embodiment, the wavelength-conversion layers 20 and 22 can be directly mounted on the first face (the shown upper face) and/or the second face (the shown lower face) of the semiconductor light emitting element 14, respectively. Such direct mounting can keep the device miniaturized and prevent the enlargement of the light source size. When the semiconductor light emitting element 14 is configured to emit blue light, the wavelength-conversion layers 20 and 22 can be a resin material or a ceramic material containing, for example, a YAG type phosphor or a silicate type phosphor. The blue light from the semiconductor light emitting element 14 and yellow light from the wavelength conversion layers 20 and 22 can produce (pseudo) white light.

The combination of the semiconductor light emitting element 14 and the wavelength-conversion layer 20 (22) are the blue light emission LED element and YAG phosphor or silicate phosphor in the present exemplary embodiment, but the presently disclosed subject matter can employ various other appropriate combinations. For example, an LED element for emitting ultraviolet light or near-ultraviolet light can be combined with a wavelength conversion layer capable of being excited by the light from the LED element and emitting blue, green, and red light to produce a desired colored white light.

The wavelength-conversion layers 20 and 22 mounted on the first and second faces, respectively, can be composed of different compositions from each other. When the wavelength-conversion layers 20 and 22 have different compositions from each other, the light having passed through the first face-side wavelength-conversion layer and the light having passed through the second face-side wavelength-conversion layer can be allowed to have different color temperature or chromaticity. For example, any of the wavelength-conversion layers 20 and 22 can include a red phosphor (which is excited so as to emit red light) to emit light with different color temperature or chromaticity.

The blue light component has been shown to be helpful for the peripheral vision of human eyes (as compared to the center vision thereof) in terms of visibility. Accordingly, when the lighting device 10 of FIG. 1 is used for a vehicle headlight, the contained phosphors or the like in the wavelength-conversion layers 20 and 22 can be adjusted so that the white light from the second face of the light emitting element 14 to the reflector 18 of the second optical system can include more blue light component than the white light from the first face of the light emitting element 14 to the projection lens 12 of the first optical system. In this way, the lighting device of the presently disclosed subject matter can provide light having a beneficial light distribution property in which the peripheral area thereof contains a blue light component that is helpful for the peripheral vision of human eyes as compared to the center area vision thereof.

The lighting device of the presently disclosed subject matter can provide a light distribution pattern partly having different tone by using the wavelength-conversion layers 20 and 22 on the first face and the second face, having different compositions without any difficulty. By doing so, the light diffused towards peripheries can have particular color light components beneficial for the peripheral vision of human eyes.

The wavelength-conversion layers 20 and 22 can be fabricated by various methods including a dispenser method, a printing method, and the like methods, over the first face and the second face of the semiconductor light emitting element 14, respectively.

Alternatively, if the semiconductor light emitting element 14 is mounted on the mounting substrate 16 with the use of a silicone adhesive, the adhesive can contain a proper phosphor so that the cured adhesive can function as the wavelength-conversion layer 22 on the second face side.

In the presently disclosed subject matter, the wavelength-conversion layer may be disposed directly on the semiconductor light emitting element (on the outermost layer thereof), but it is not limitative. As long as the wavelength-conversion layer can wavelength-convert the light from the semiconductor light emitting element, it can be disposed at various other positions including a position over the first face (upper surface of the illustrated example) or the lower side (in the drawing) of the second face thereof. If the mounting substrate has a through hole for the light transmission purpose, the wavelength-conversion layer can be provided inside and/or adjacent the through hole.

FIG. 2B shows the configuration wherein the mounting substrate 16 is not entirely transparent, but has a transparent area (portion) where the second face of the semiconductor light emitting element 14 faces thereto. Specifically, the mounting substrate 16 can include an opaque substrate 16c, wiring 16b formed on the opaque substrate 16c, and a transparent portion 16d. Examples of the opaque substrate 16c can include, for example, a glass-epoxy substrate.

The light emitted from the second face of the semiconductor light emitting element 14 can pass through the transparent portion 16d of the substrate 16 so as to enter the second optical system, or the reflector. In this case, the transparent portion 16d can be 80% or more in transmittance, and possibly 90% or more with regard to the light emitted from the second face of the semiconductor light emitting element 14. Note that in FIG. 2B a driving circuit (not shown) can be formed on the opaque substrate 16c for driving the semiconductor light emitting element 14.

When the mounting substrate 16 as shown in FIG. 2A or 2B is used, the wavelength-conversion layer 22 can be disposed not only on the second face of the semiconductor light emitting element 14, but also the mounting surface of the substrate 16 (the first face of the substrate 16 or upper surface in the drawing) or the surface opposite to the mounting surface (the second face of the substrate 16 or lower surface in the drawing) as long as the wavelength-conversion layer 22 can wavelength-convert the light emitted from the second face of the semiconductor light emitting element 14.

When the mounting substrate 16 as shown in FIG. 2A or 2B is used (the case where the mounting area of the substrate for the semiconductor light emitting element 14 has a transparent portion), the semiconductor light emitting element 14 can be adhered to the mounting substrate 16 with the use of a transparent adhesive such as a silicone adhesive. In this case, the sapphire substrate 14a of the semiconductor light emitting element 14 as the to-be-mounted surface (as the second face) can be adhered and fixed to the mounting substrate 16 with the use of a silicone adhesive (not illustrated). Then, the n-electrode 14e and the p-electrode 14f of the semiconductor light emitting element 14 on the first face side can be appropriately connected electrically with the wiring 16b with the use of gold wire or the like.

The mounting substrate 16 shown in FIG. 2C can include an opaque substrate 16c and wiring 16b formed on the opaque substrate 16c. In particular, the substrate 16c can have a through hole 16f formed therethrough at a position where the second face of the semiconductor light emitting element 14 faces thereto. Accordingly, the light emitted from the second face of the semiconductor light emitting element 14 can pass through the through hole 16f of the mounting substrate 16 so as to enter the second optical system.

In the exemplary embodiment of FIG. 2C, the wavelength-conversion layer 22 on the second face side can be arranged to be filled in the through hole 16f. Accordingly, the light emitted from the wavelength-conversion layer 22 can have the shape corresponding to the shape of the through hole 16f. This means that the mounting substrate 16 can function as a light shielding member. Thus, the light emitted from the second face of the light emitting element 14 can pass through the through hole serving as the light shielding member to form a predetermined illumination pattern. For example, when the lighting device 10 is used for a vehicle headlight, the shape of the through hole 16f can be a shape corresponding to a low-beam light distribution pattern. In this way, the light emitted from the second face can be provided with the low-beam light distribution pattern.

The semiconductor light source devices shown in FIGS. 2A to 2C include a semiconductor light emitting element 14 directly mounted on the mounting surface 16 as examples, but the presently disclosed subject matter is not limited to those specific examples. For example, the semiconductor light emitting element can be mounted on a transparent submount, and the submount can be mounted on the mounting substrate, so that the semiconductor light emitting element can be mounted on the mounting substrate via the submount.

In another exemplary embodiment, the semiconductor light emitting element 14 can be mounted with the aid of bumps 14g and the opaque mounting substrate that can cover part of the semiconductor light emitting element 14. In this case, the bumps 14g can be formed on the part of the surface of the mounting substrate covering the light emission surface of the element 14 to serve as bump portions. It should be noted that the bumps 14g may not be provided over the entire periphery, but can be provided only partly on the periphery. This can clearly separate the desired light emission shape and the bump portions. When bumps are formed within a light emission area of the semiconductor light emitting element, the light emission shape and properties of the light emission surface 14h may be affected by the bumps. The above configuration of the presently disclosed subject matter, however, can maintain the desired light emission shape without any disadvantageous effects.

As described above, the semiconductor light emitting element 14 can be fabricated by stacking, on a transparent support substrate or a sapphire substrate 14a, an n-GaN layer 14b, a light emitting layer 14c, and a p-GaN layer 14d by an epitaxial growth method or adhesion method. The semiconductor light emitting element 14 can have a thin plate shape with the size of, for example, 1 mm (1)×1 mm (w)×100 µm (t). In some applications, the shape may not be square, but rectangular having the size of, for example, 1 mm (1)×2 mm (w), but not limited thereto, and can include other shapes as well depending on the application and/or desired light distribution.

In another application, a plurality of square semiconductor light emitting elements 14 can be disposed in line. Almost all of the light generated from each of the semiconductor light emitting elements 14 can be projected from the first face and the second face. Accordingly, there is no need to provide an additional optical system for light emitted from the side faces between them. Accordingly, the lighting device can be thinner when compared with conventional halogen or HID lamps that illuminate in all directions.

If there is any problem associated with the light emission from the side faces of the semiconductor light emitting element 14, reflection films or the like may be provided to the side faces. Such reflection films can effectively prevent light leakage from the side faces. In this case, the reflection film can be provided onto the side faces of the semiconductor light emitting element 14 by vapor deposition techniques or the like. The reflection film may be a single film of, for example, an insulating high reflection film or stacked films.

Alternatively, the reflection film can be provided onto the side faces of the semiconductor light emitting element 14 by coating the side faces with a white coating. The white coating can be prepared by mixing titanium oxide or aluminum oxide particles into a resin material so as to become a white high reflection film.

In the semiconductor light source devices of FIGS. 2A to 2C, the wavelength-conversion layers 20 and 22 are disposed on both the first and second face sides of the semiconductor light emitting elements 14. However, the presently disclosed subject matter may include only one of them or no wavelength-conversion layer in accordance with the required or desired specifications.

A description will now be given of the operation of the lighting device 10 of the presently disclosed subject matter with reference to FIG. 1 and FIGS. 2A to 2C.

When the semiconductor light emitting element 14 mounted on the mounting substrate 16 is supplied with a driving current through the wiring 16b, the semiconductor light emitting element 14 can emit light with predetermined colors from the first and second faces, respectively. For example, blue light can be emitted from the first and second faces of the semiconductor light emitting element 14.

Then, the blue light can enter the wavelength-conversion layers 20 and 22 to be wavelength-converted by the contained phosphor into yellow light. As a result, the blue light which has passed through the wavelength-conversion layers 20 and 22 without wavelength conversion can be synthesized with the yellow light to generate (pseudo) white light.

The white light from the wavelength-conversion layer 20 on the first face side can enter the projection lens 12 of the first optical system. The projection lens 12 can project the light in the illumination direction with a predetermined first light distribution pattern imparted to the light.

The white light from the wavelength-conversion layer 22 on the second face side can pass through the mounting substrate 16 and enter the reflector 18 of the second optical system. The reflector 18 can reflect the light in the illumination direction with a predetermined second light distribution pattern imparted to the light.

Figure 3:
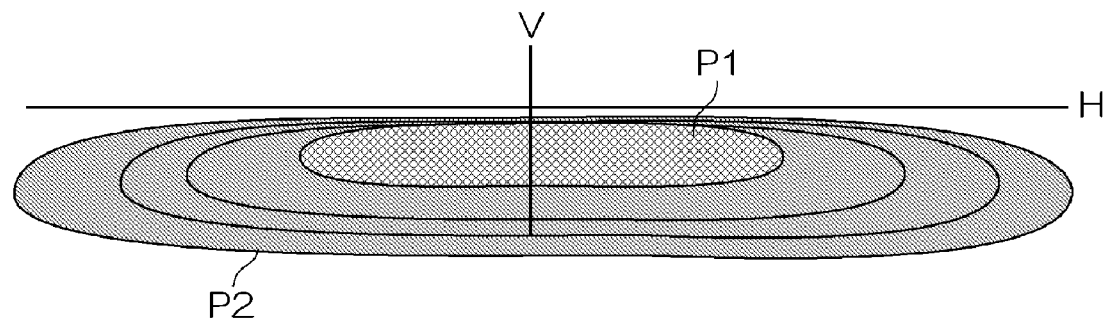
FIG. 3 is a schematic view illustrating a light distribution pattern formed by the lighting device of the first exemplary embodiment.

FIG. 3 shows the light distribution pattern formed by the lighting device 10 of the present exemplary embodiment. This light distribution pattern is a synthesized light distribution pattern including the first light distribution pattern P1 formed by the first optical system and the second light distribution pattern P2 formed by the second optical system.

In FIG. 3, the center area near the HV crossing point may require the light intensity of, for example, approximately 6000 cd to 35000 cd. As the area is farther from the HV crossing point area, the required intensity may be significantly decreased. A conventional single light source module utilizing a semiconductor light emitting element cannot achieve such a light distribution pattern with a large area of variation in intensity. On the contrary, the lighting device 10 of the presently disclosed subject matter can be provided with two types of optical systems each capable of imparting different light distribution patterns to light emitted from the corresponding faces of the semiconductor light emitting element 14. Accordingly, one optical system can form the first light distribution pattern P1 with a high intensity whereas the other optical system can form the second light distribution pattern P2 with moderate intensity by appropriately diffusing light. These first and second light distribution patterns can be synthesized with each other to form the desired light distribution pattern.

As described above, the wavelength-conversion layers 20 and 22 disposed on respective faces of the semiconductor light emitting element 14 may have respective different structures. Accordingly, in accordance with need or desire, the second light distribution pattern P2 formed by the second optical system can include more blue light component than the first light distribution pattern P1 formed by the first optical system. The second light distribution pattern P2 is disposed on the peripheral portion farther from the center area of the light distribution pattern so that the blue light component can be located more in the peripheral area for the peripheral vision of human eyes.

When the wavelength-conversion layers 20 and 22 have the same phosphor concentration, the thickness adjustment of the wavelength-conversion layer 22 can allow the second light distribution pattern P2 to contain more blue light component. The thinner the wavelength-conversion layer 22, the lesser the amount of phosphor that is to be excited in that area where the blue light from the semiconductor light emitting element 14 passes. This can allow a greater amount of the blue light component to be contained in the white light to be emitted.

When the thickness of the wavelength-conversion layer 20 is the same as the layer 22, the same effect can be obtained by adjusting the phosphor concentration of each of the layers 20 and 22 in accordance with the required or desired blue light component.

Second Exemplary Embodiment

Figure 4:
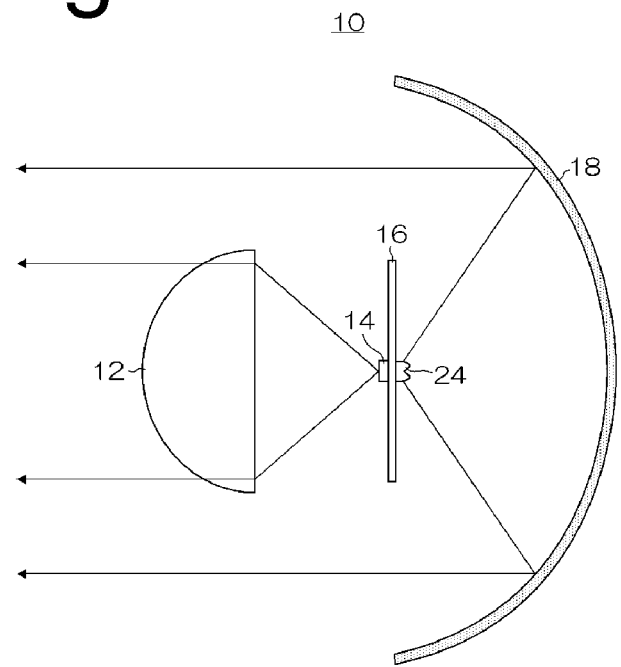
FIG. 4 is a schematic view illustrating a second exemplary embodiment of a lighting device made in accordance with principles of the presently disclosed subject matter.

A description will now be given of the second exemplary embodiment of the presently disclosed subject matter with reference to FIG. 4. FIG. 4 is a schematic cross-sectional view illustrating the second exemplary embodiment of a lighting device made in accordance with principles of the presently disclosed subject matter. Please note that the same components as that in the first exemplary embodiment will be denoted by the same reference numeral, and a description thereof will be omitted appropriately.

The lighting device 10 of FIG. 4 can include a semiconductor light emitting element 14, a mounting substrate 16 configured to allow the semiconductor light emitting element 14 to be mounted thereon, a projection lens 12 disposed at a position where the lens 12 can receive the light emitted from the first face of the semiconductor light emitting element 14, an optical member 24 provided on the face of the mounting substrate 16 opposite to the first face of the substrate 16 where the semiconductor light emitting element 14 is mounted, and a reflector 18. The reflector 18 is disposed on the same side as the optical member 24 and can be configured to receive light emitted from the optical member 24.

The optical member 24 can be configured to decrease the light emitted along or in the optical axis direction of the second face of the semiconductor light emitting element 14 (perpendicular direction to the second face) and direct the light outward from the optical axis as shown in FIG. 4. This configuration can prevent the light emitted from the second face outwardly and reflected by the reflector 18 of the second optical system from entering the projection lens 12 of the first optical system. Accordingly, the optical member 24 can reliably separate the light to be controlled by the first optical system from the light to be controlled by the second optical system. This configuration of the lighting device 10 can provide a desired light distribution pattern. As the optical axis of the first face of the semiconductor light emitting element 14 is not parallel with that of the second face thereof, the optical system can be configured to effectively utilize the emitted light.

Figure 5A:
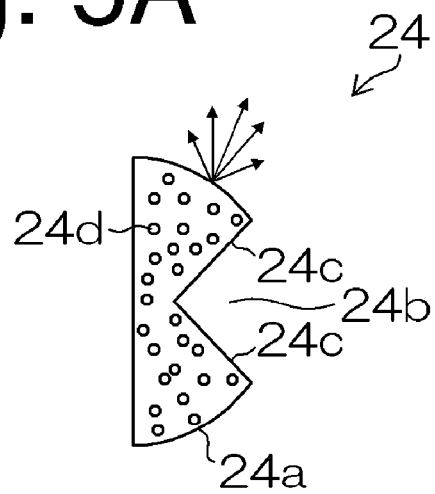
FIGS. 5A, 5B, and 5C are schematic views of various exemplary optical members that can be applied to the second exemplary embodiment.
Figure 5B:
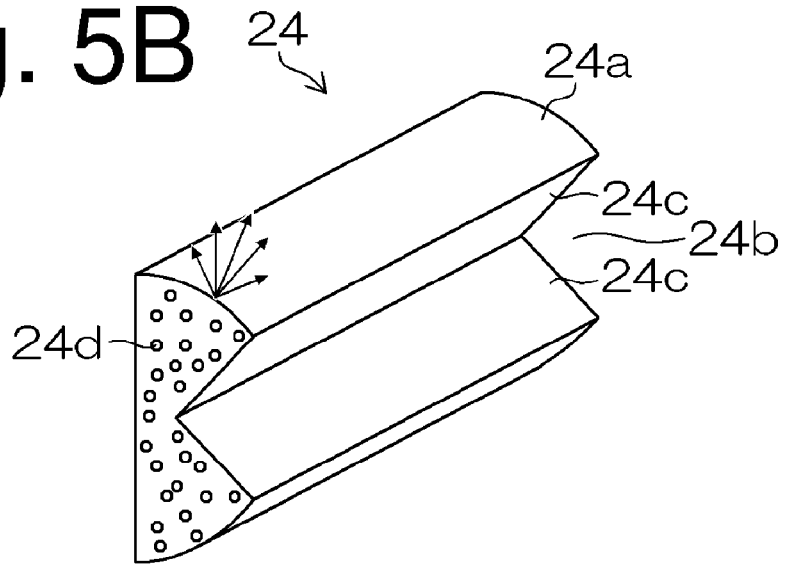
Figure 5C:
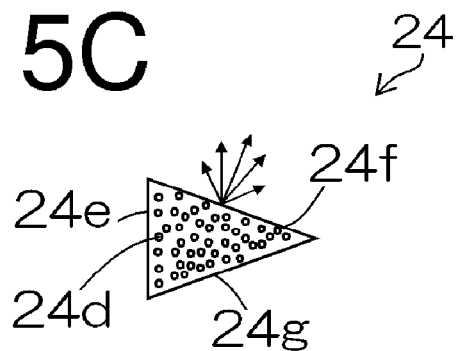

FIGS. 5A, 5B, and 5C are schematic views of various exemplary optical members 24 to be applied to the second exemplary embodiment.

The optical member 24 of FIG. 5A can include a light emission part 24a of an approximately semi-spherical lens shape, a groove 24b formed on the apex of the semi-spherical light emission part 24a, and a reflection film 24c formed on the surface of the groove 24b. The light emission part 24a is disposed on the mounting substrate so as to be directed toward the reflector 18 of the second optical system. It should be noted that the optical member 24 can contain a diffusion material 24d (such as fine polymer beads) mixed therein.

The optical member 24 can receive the light emitted from the second face of the semiconductor light emitting element, and the reflection film 24c can reflect the light to the outside. Accordingly, the light allowed to enter the second optical system along the optical axis direction can be decreased. When the diffusion material 24d is mixed to the optical member 24, the light emitted in the optical axis direction can be decreased even more. Accordingly, the light emitted from the second face of the semiconductor light emission element in the optical direction perpendicular to the second face can be properly reflected by the second optical system so that the reflected light is prevented from entering the first optical system.

The optical member 24 of FIG. 5B can include a light emission part 24a of an approximately semi-cylindrical lens shape, a groove 24b formed on the apex of the semi-cylindrical light emission part 24a, and a reflection film 24c formed on the surface of the groove 24b. In this case, the emission surface of the optical member 24 can include two rectangular surfaces. Such an optical member 24 including rectangular emission surfaces can facilitate the formation of the light distribution pattern like that shown in FIG. 3.

The optical member 24 of FIG. 5C can include a triangular columnar shaped light emission part.

The side face 24e of the triangular prism can receive the light emitted from the second face of the semiconductor light emitting element 14 and the other two side faces 24f and 24g can project the light. This optical member 24 also has two rectangular light emission faces, and accordingly, can have the same advantageous effects as that of the optical member of FIG. 5B described above. This optical member 24 can contain a diffusion material 24d similar to or the same as that of the optical members 24 of FIGS. 5A and 5B.

Figure 6:
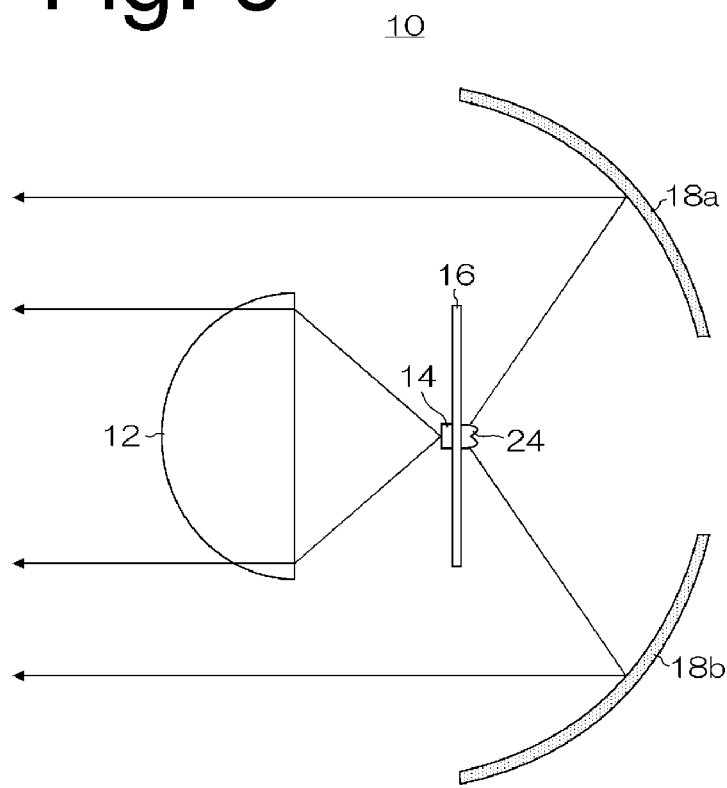
FIG. 6 is a schematic view illustrating a modified example of the second exemplary embodiment.

FIG. 6 shows a modified example of the second exemplary embodiment. The illustrated lighting device 10 is different from that of FIG. 4 in that the reflector 18 of the second optical system can have separate first and second reflectors 18a and 18b. Specifically, there is no reflector on the line extending from the optical axis of the second face of the semiconductor light emitting element 14. Accordingly, the reflector 18 of the second optical system is not involved in reflecting the light from the second face of the semiconductor light emitting element 14 in the optical axis direction. This configuration, therefore, can prevent the light emitted from the second face of the semiconductor light emitting element 14 and reflected by the second optical system from entering the first optical system. As the light emitted from the second face of the semiconductor light emitting element 14 can be directed by the optical member 24 to the outside of the optical axis, the light can be allowed to enter the second optical system without substantial loss of light.

The present exemplary embodiment can appropriately utilize the semiconductor light source device shown in any of FIGS. 2A to 2C. The thus prepared configuration of the lighting device 10 of the present exemplary embodiment can provide the same light distribution pattern as that shown in FIG. 3.

Third Exemplary Embodiment

Figure 7:
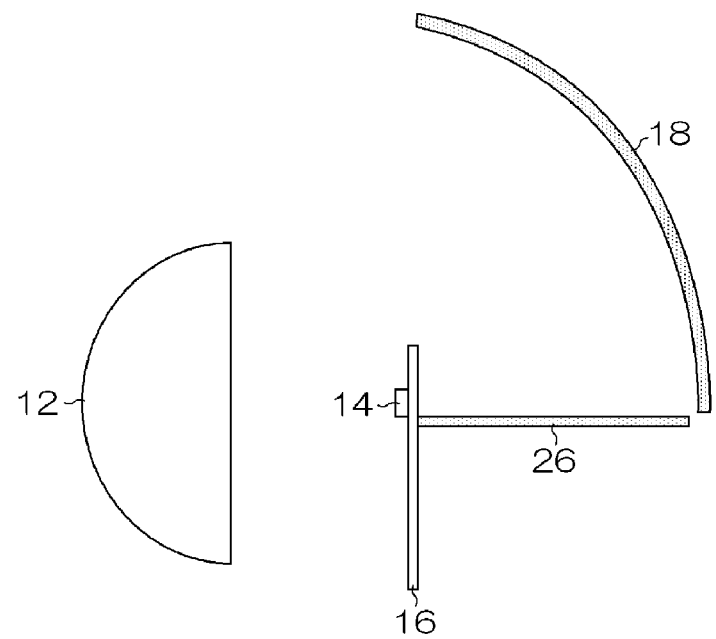
FIG. 7 is a schematic view illustrating a third exemplary embodiment of a lighting device made in accordance with principles of the presently disclosed subject matter.

A description will now be given of a third exemplary embodiment of the presently disclosed subject matter with reference to FIG. 7. FIG. 7 is a schematic cross-sectional view illustrating the third exemplary embodiment of a lighting device made in accordance with principles of the presently disclosed subject matter. Please note that the same components as those in the first or second exemplary embodiment will be denoted by the same reference numerals, and a description thereof will be omitted appropriately.

The lighting device 10 of FIG. 7 can include a semiconductor light emitting element 14, a mounting substrate 16 configured to allow the semiconductor light emitting element 14 to be mounted thereon, a projection lens 12 disposed at a position where the lens 12 can receive the light emitted from the first face of the semiconductor light emitting element 14, a reflection plate 26 provided on the side of the mounting substrate 16 opposite to the first face side of the substrate 16 where the semiconductor light emitting element 14 is mounted, and a reflector 18. The reflector 18 is disposed on the same side of the reflection plate 26 and can be configured to receive light reflected by the reflection plate 26. The reflection plate 26 can be disposed approximately perpendicular to the mounting substrate 16.

The light emitted from the second face of the semiconductor light emitting element 14 can pass through the mounting substrate to be reflected by the reflection plate 26 in a predetermined direction. The reflected light can enter the reflector 18 to be reflected in the forward illumination direction. As shown in FIG. 7, the light emitted from the second face of the semiconductor light emitting element 14 can be directed by the reflection plate 26 in a predetermined direction. Accordingly, the reflector 18 in this exemplary embodiment can be decreased in size when compared with the lighting devices of the first and second exemplary embodiments. This can decrease the entire size of the lighting device 10, accordingly.

In the presently disclosed subject matter, the light emitted from the second face of the semiconductor light emitting element 14 can be reflected by the reflection plate 26 to be guided toward the reflector 18. Accordingly, the light emitted from the second face of the semiconductor light emitting element 14 is not always incident directly on the reflector 18. The light emitted from the second face may be incident on the reflector 18 after passing along a plurality of various optical paths.

The present exemplary embodiment can appropriately utilize the semiconductor light source device shown in any of FIGS. 2A to 2C. The thus prepared configuration of the lighting device 10 of the present exemplary embodiment can provide the same or similar light distribution pattern(s) as that shown in FIG. 3.

Fourth Exemplary Embodiment

Figure 8:
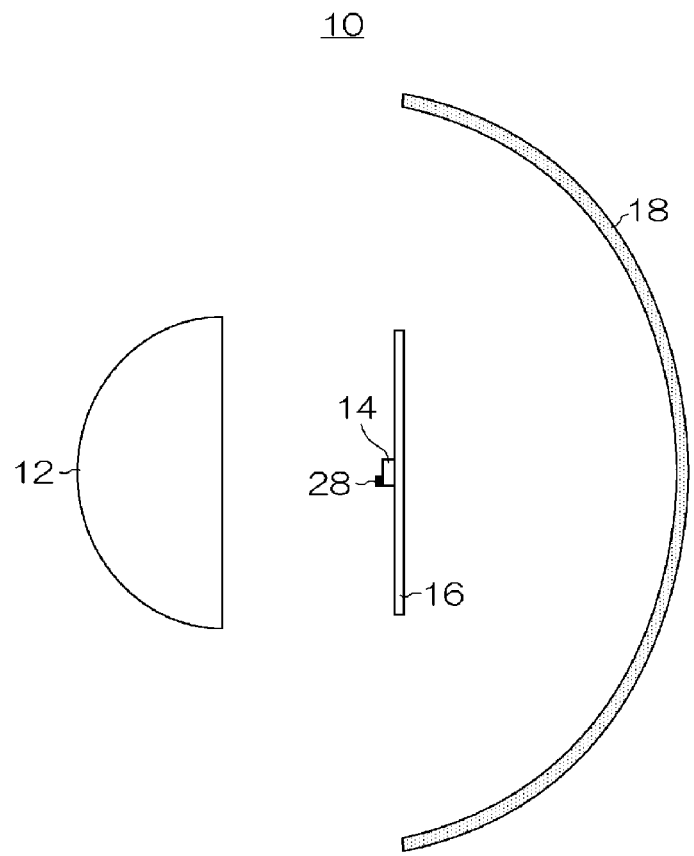
FIG. 8 is a schematic view illustrating a fourth exemplary embodiment of a lighting device made in accordance with principles of the presently disclosed subject matter.

A description will now be given of a fourth exemplary embodiment of the presently disclosed subject matter with reference to FIG. 8. FIG. 8 is a schematic cross-sectional view illustrating the fourth exemplary embodiment of a lighting device made in accordance with principles of the presently disclosed subject matter. Please note that the same components as those in the first to third exemplary embodiments will be denoted by the same reference numerals, and a description thereof will be omitted appropriately.

When compared with the lighting device 10 of FIG. 1, the lighting device 10 of FIG. 8 can include a light shielding member 28 disposed on or adjacent the first face of the semiconductor light emitting element 14. The light shielding member 28 can be formed directly on the first face of the semiconductor light emitting element 14 or disposed adjacent the first face. The light shielding member 28 can have a shape for imparting a low beam light distribution pattern to the light emitted from the first optical system.

The light shielding member 28 can be formed of a film with a high reflectivity, such as aluminum film, silver film, or alloy film of aluminum, silver or the like. In this case, the light shielding member 28 of a high reflectivity film can be formed by any vapor deposition methods on the semiconductor light emitting element 14. When the light shielding member 28 is formed of a high reflectivity film, the light emitted from the first face of the semiconductor light emitting element 14 can include a cutoff line required for forming a low beam light distribution pattern. The light shielded by the light shielding member 28 can be reflected by the same to be emitted from the second face of the semiconductor light emitting element 14 advantageously. This can prevent light loss due to the cutoff by a conventional light shielding member.

When the wavelength-conversion layer is disposed on the first face side of the semiconductor light emitting element 14, the light shielding member 28 can be disposed on the wavelength-conversion layer or on the first face of the semiconductor light emitting element 14 along with the wavelength-conversion layer.

A description will now be given of the operation of the lighting device 10 of the presently disclosed subject matter with reference to FIG. 8. When the semiconductor light emitting element 14 mounted on the mounting substrate 16 is supplied with a driving current from a not-shown DC power source, predetermined emission light is emitted from the first and second faces of the semiconductor light emitting element 14.

In this case, the light emitted from the first face of the semiconductor light emitting element 14 can be shielded by the light shielding member 28 disposed on the first face side of the semiconductor light emitting element 14. The light not shielded by the light shielding member 28 can be projected toward the projection lens 12. As the light shielding member 28 can be formed in a shape corresponding to a low beam light distribution pattern, an appropriate low beam light distribution pattern can be imparted to the light emitted from the projection lens 12.

When the light shielding member 28 is formed of a high reflectivity film, the light shielded by the member 28 can be reflected by the member 28 to be emitted from the second face together with the originally emitted light from the second face to pass through the mounting substrate 16 and then enter the reflector 18. The light can be reflected by the reflector 18 in the forward illumination direction while a second light distribution pattern is imparted to the light. This configuration can advantageously utilize the light directly emitted in the forward illumination direction and shielded by a shielding member as light in the direction toward the second face (second optical system).

Figure 9:
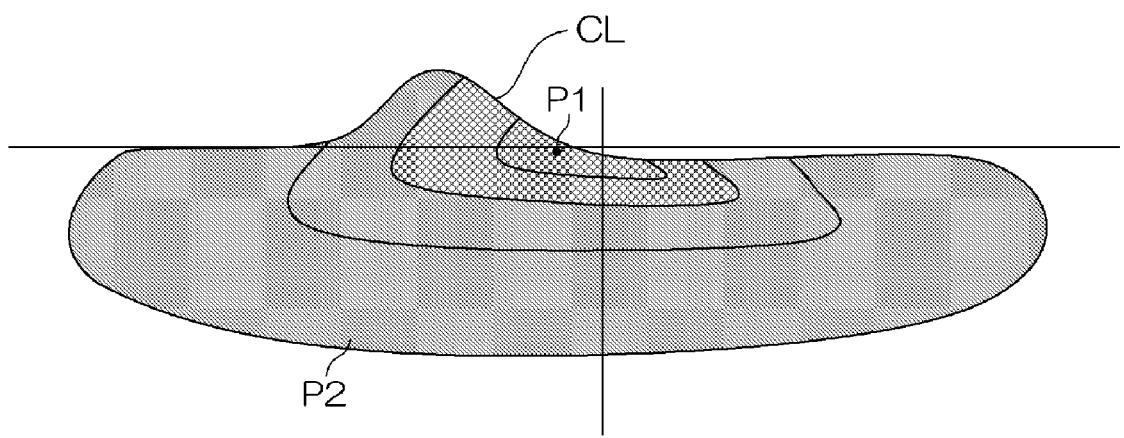
FIG. 9 is a schematic view illustrating a light distribution pattern formed by the lighting device of the fourth exemplary embodiment.

FIG. 9 shows a light distribution pattern formed by the lighting device 10 of the fourth exemplary embodiment. This light distribution pattern is a synthesized light distribution pattern including the first light distribution pattern P1 formed by the first optical system and the second light distribution pattern P2 formed by the second optical system.

The light distribution pattern, as shown in FIG. 9 can include a cutoff line CL for a low beam light distribution pattern. As in FIG. 9, the center area near the HV crossing point may require the light intensity of, for example, approximately 6000 cd to 35000 cd and can be composed mainly of the first light distribution pattern P1 formed by the first optical system including the cutoff line CL cut by the light shielding member 28. The area that surrounds the first light distribution pattern P1 and may include the relatively low intensity of light can be composed mainly of the second light distribution pattern P2 formed by the second optical system.

Accordingly, in the present exemplary embodiment, the area with a high intensity including the cutoff line can be formed by the first light distribution pattern P1 whereas the diffusion area not including too-high intensity can be formed by the second light distribution pattern P2. The combination thereof can achieve a light distribution pattern suitable for passing-by travelling (or low beam light distribution pattern).

The present embodiment can appropriately utilize the semiconductor light source device shown in any of FIGS. 2A to 2C.

Fifth Exemplary Embodiment

Figure 10:
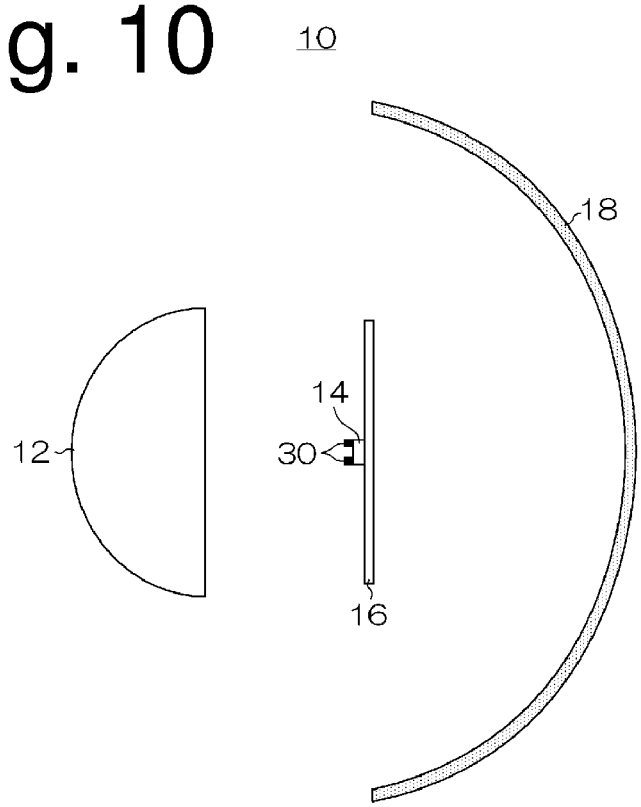
FIG. 10 is a schematic view illustrating a fifth exemplary embodiment of a lighting device made in accordance with principles of the presently disclosed subject matter.

A description will now be given of a fifth exemplary embodiment of the presently disclosed subject matter with reference to FIG. 10. FIG. 10 is a schematic cross-sectional view illustrating the fifth exemplary embodiment of a lighting device made in accordance with principles of the presently disclosed subject matter. Please note that the same components as those in the first to fourth exemplary embodiments will be denoted by the same reference numerals, and a description thereof will be omitted appropriately.

The lighting device 10 of FIG. 10 can include, in addition to the components of the lighting device 10 of FIG. 1, light shielding members 30 disposed on the periphery of the first face of the semiconductor light emitting element 14.

The light shielding members 30 of the lighting device 10 of the presently disclosed subject matter can be applied even in the case where the lighting device cannot be formed to a specific shape for the purpose of achieving a specific light distribution pattern due to various reasons, and cannot decrease the light emission area on the upper side of the semiconductor light emitting element 14.

In the presently disclosed subject matter, the light shielding members 30 can cover, and therefore decrease, the light emission area of the first face of the semiconductor light emitting element 14. This configuration can allow the emission light of the first face to serve as a point light source or the like. Accordingly, this configuration can also employ the first optical system having a reduced size, leading to the miniaturization of the entire lighting device 10. The size of the first optical system can be made small to reduce the amount of light emitted from the second optical system and shielded by the first optical system to be projected in the forward illumination direction.

As in the fourth exemplary embodiment, the light shielding member 30 can be formed of a film with a high reflectivity, such as aluminum film, silver film, or alloy film of aluminum, silver or the like. The high reflectivity film can be formed by vapor deposition methods on the semiconductor light emitting element 14. The light shielded by the light shielding members 30 can be reflected by the members 30 to be emitted from the second face of the semiconductor light emitting element 14. This can prevent light loss due to the cutoff as can occur in a conventional shielding member.

Instead of the light shielding member 30, an optical element for gathering light emitted from the first face of the semiconductor light emitting element 14 can be provided on the first face side of the semiconductor light emitting element 14. In this case, the light emission surface of the semiconductor light emitting element 14 can serve as a point light source so that the first optical system can be minimized.

The present exemplary embodiment can appropriately utilize the semiconductor light source device shown in any of FIGS. 2A to 2C. The thus prepared configuration of the lighting device 10 of the present exemplary embodiment can provide the same or similar light distribution pattern as that shown in FIG. 3.

Sixth Exemplary Embodiment

Figure 11:
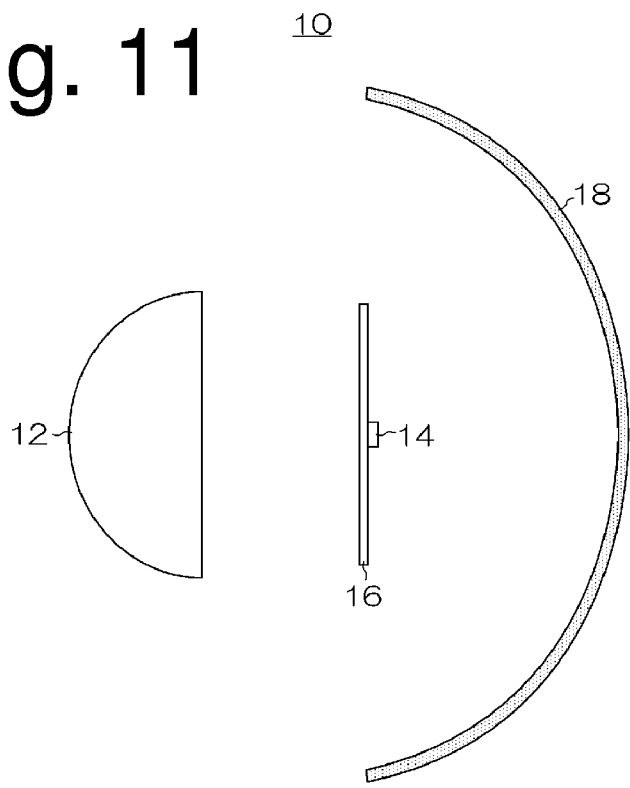
FIG. 11 is a schematic view illustrating a sixth exemplary embodiment of a lighting device made in accordance with principles of the presently disclosed subject matter.

A description will now be given of a sixth exemplary embodiment of the presently disclosed subject matter with reference to FIG. 11. FIG. 11 is a schematic cross-sectional view illustrating the sixth exemplary embodiment of a lighting device made in accordance with principles of the presently disclosed subject matter. Please note that the same components as those in the first to fifth exemplary embodiments will be denoted by the same reference numerals, and a description thereof will be omitted appropriately.

The lighting device 10 of FIG. 11 has a semiconductor light source device disposed in a reverse direction as compared with that of FIG. 1. Namely, the first face of the semiconductor light emitting element 14 does not face towards the projection lens 12, but towards the reflector 18, whereas the second face faces towards the projection lens 12. Accordingly, in this exemplary embodiment the reflector 18 can constitute the first optical system and the projection lens 12 can constitute the second optical system.

The present exemplary embodiment can appropriately utilize the semiconductor light source device shown in any of FIGS. 2A to 2C. In addition, the transparent portion 16d or the through hole 16f of the mounting substrate 16 can be provided and shaped in the same shape as that of a low beam light distribution pattern. Thus, the low beam light distribution pattern can be easily imparted to the light emitted from the second face of the semiconductor light emitting element 14.

Accordingly, the through hole of the mounting substrate 16 can form the low beam light distribution pattern without any shielding member 18 provided on or adjacent the first face of the semiconductor light emitting element 14 described in the fourth exemplary embodiment.

FIG. 12 shows a modified example of the sixth exemplary embodiment. The lighting device 10 of FIG. 12 can include, in addition to the components of the lighting device 10 of FIG. 11, a lens 32 provided on the side of the mounting substrate 16 opposite to the side of the substrate 16 where the semiconductor light emitting element 14 is mounted.

A conventional halogen lamp cannot include a lens directly mounted and in contact with a light source due to generated heat. However, a semiconductor light emitting element 14 with less heat generation can include a lens 32 being in contact with the light source. This configuration can gather the light emitted from the second face of the semiconductor light emitting element 14 advantageously, thereby increasing the light utilization efficiency.

The present exemplary embodiment can appropriately utilize the semiconductor light source device shown in any of FIGS. 2A to 2C. The thus prepared configuration of the lighting device 10 of the present exemplary embodiment can provide the same or similar light distribution pattern as that shown in FIG. 3. In particular, the transparent portion or the through hole of the mounting substrate 16 can be shaped in the same shape as that of the low beam light distribution pattern. Thus, the low beam light distribution pattern can be easily imparted to the light as in the case of FIG. 9.

Seventh Exemplary Embodiment

Figure 13A:
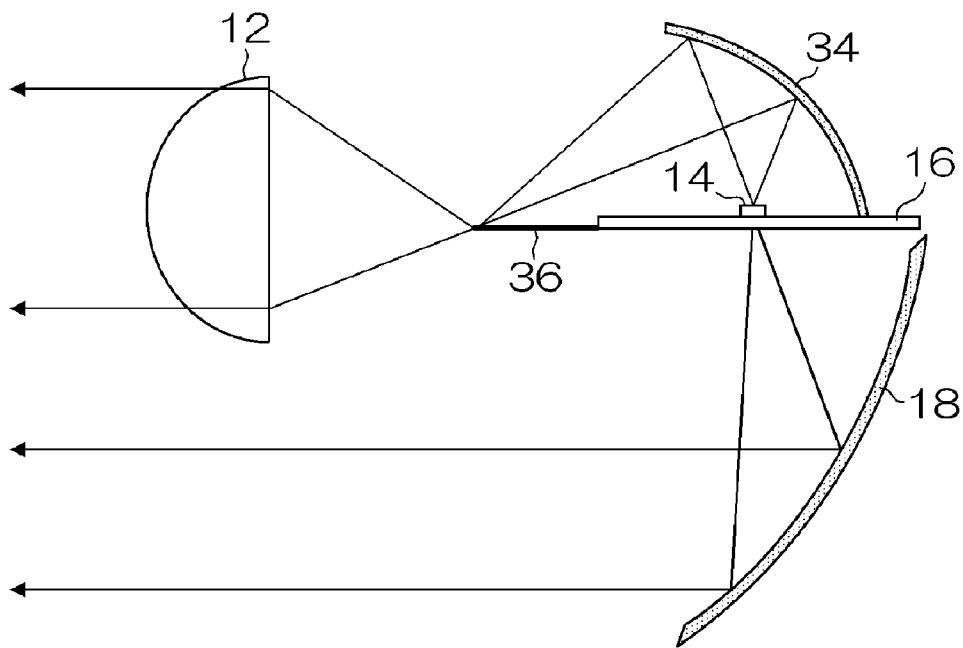
FIGS. 13A and 13B are schematic views illustrating a seventh exemplary embodiment of a lighting device made in accordance with principles of the presently disclosed subject matter and a modified example thereof, respectively.
Figure 13B:
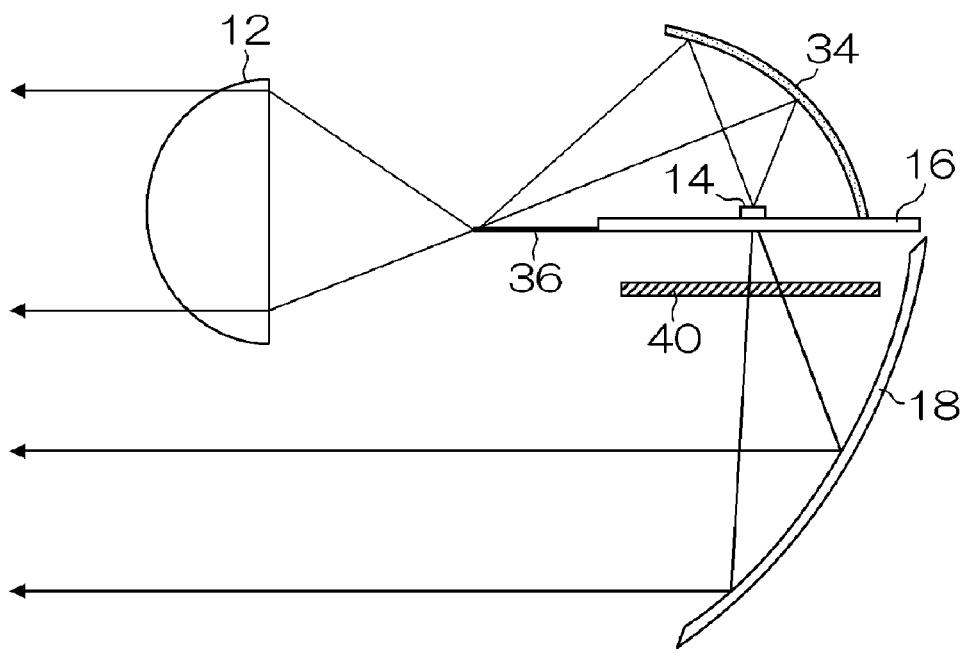

A description will now be given of a seventh exemplary embodiment of the presently disclosed subject matter with reference to FIGS. 13A and 13B. FIGS. 13A and 13B are schematic cross-sectional views illustrating the seventh exemplary embodiment of a lighting device made in accordance with principles of the presently disclosed subject matter. Please note that the same components as those in the first to sixth exemplary embodiments will be denoted by the same reference numerals, and a description thereof will be omitted appropriately.

The lighting device 10 of FIG. 13A can include a semiconductor light emitting element 14, a mounting substrate 16 configured to allow the semiconductor light emitting element 14 to be mounted thereon, a reflector 34 disposed at a position where the reflector receives the light emitted from the first face of the semiconductor light emitting element 14, a projection lens 12 disposed at a position where the lens 12 receives the light emitted from the first face of the semiconductor light emitting element 14 and reflected by the reflector 34, another reflector 18 disposed on the opposite side of the reflector 34 and configured to receive light emitted from the second face of the semiconductor light emitting element 14, and a reflection plate 36 provided on the tip of the mounting substrate 16 near the projection lens and in parallel with the optical axis of the projection lens 12.

In the present exemplary embodiment, the semiconductor light emitting element 14 is disposed such that the optical axes of the first face and the second face of the semiconductor light emitting element 14 are perpendicular to the optical axis of the projection lens 12. Then, the light emitted from the first face of the semiconductor light emitting element 14 can be guided to the projection lens 12 via the reflector 34.

In the presently disclosed subject matter, the first optical system (and the second optical system) may not always be composed of a single optical member, or an overlapped light path in order to obtain a desired light distribution pattern. For example, the optical system can include various components in addition to a projection lens 12 and a reflector 18 disposed in the optical axis direction. In the present exemplary embodiment, the light from the first face and the second face are projected in the illumination direction via the respective light paths separately provided to separate optical systems. Please note that each of the optical systems may be composed of a plurality of optical members.

In the present exemplary embodiment, the reflection plate 36 can be disposed near the projection lens in order to form an appropriate light distribution pattern. It should be noted that the reflection plate 36 can be disposed along, or perpendicular to, the optical axis of the projection lens 12.

When the lighting device 10 is applied to a vehicle headlight, the reflection plate 36 can form an appropriate light distribution pattern including a low beam light distribution pattern suitable for a vehicle headlight, for example.

In another modified example, the lighting device 10 can include a movable shutter 40 disposed between the reflector 10 of the second optical system and the semiconductor light emitting element 14. In this case, the movable shutter 40 can function as a part of an Adaptive Front Lighting System (AFS). It should be noted that the movable shutter 40 can be formed of a member with high reflectivity. By utilizing such a high reflectivity movable shutter 40, the light can be reflected by the shutter 40 and emitted from the first face to enter the projection lens 12 of the first optical system. Accordingly, this configuration can facilitate the effective utilization of light from the semiconductor light emitting element 14.

Figure 14:
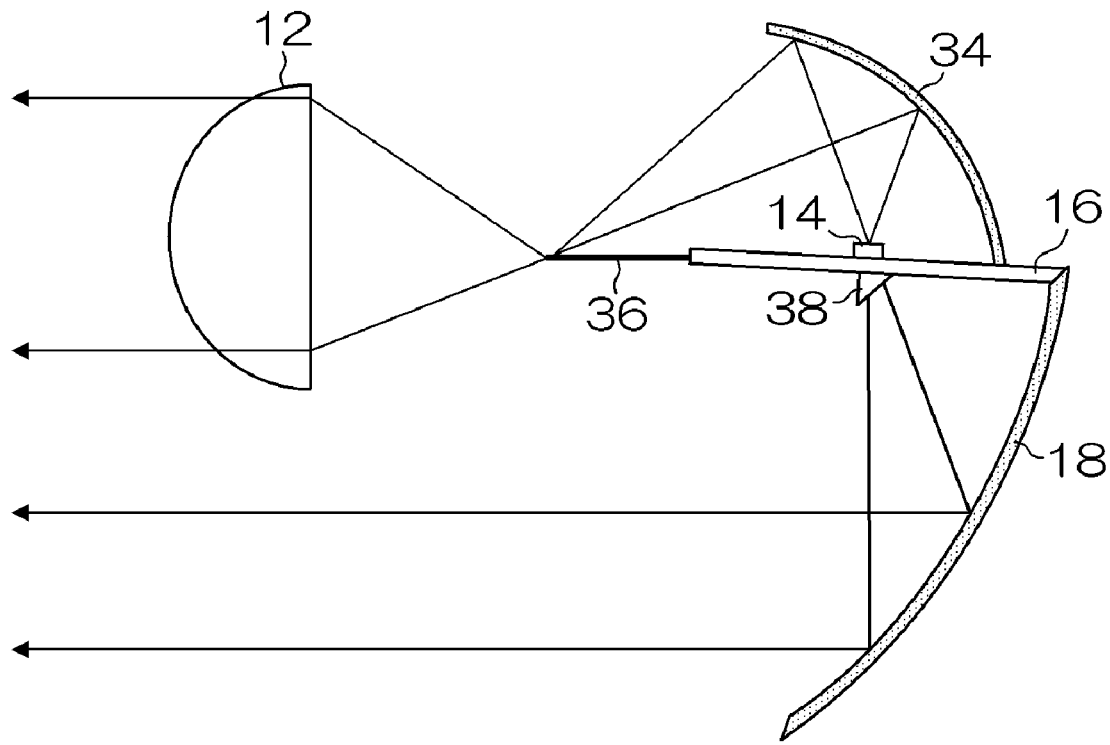
FIG. 14 is a schematic view illustrating another modified example of the seventh exemplary embodiment.

FIG. 14 shows another modified example of the seventh exemplary embodiment. The lighting device 10 of FIG. 14 can include, in addition to the components of the lighting device 10 of FIG. 13A, an optical member 38 provided on the side of the mounting substrate 16 opposite to the side of the substrate 16 where the semiconductor light emitting element 14 is mounted.

In the present exemplary embodiment, the optical axis of the semiconductor light emitting element 14 may be inclined with respect to the optical axis of the projection lens 12 so that the upper side of the axis tilts toward the reflector 34 as shown in FIG. 14. This configuration can allow the reflector 34 to be formed relatively longer in the main axis direction. Accordingly, the light emitted from the first face of the semiconductor light emitting element 14 can be reflected by the elongated reflector 34 more, so that the amount of light entering the first optical system can be increased. This can improve the utilization efficiency of light from the semiconductor light emitting element 14.

When the upper side of the optical axis of the semiconductor light emitting element 14 is allowed to tilt toward the reflector 34, the lower side of the optical axis tilts toward the projection lens 12. In order to direct the light emitted from the second face of the semiconductor light emitting element 14 to the reflector 18, the optical member 38 can be provided on the side of the mounting substrate 16 opposite to the side of the substrate 16 where the semiconductor light emitting element 14 is mounted. Accordingly, the light emitted from the second face can be surely directed in the forward illumination direction without loss of light.

Figure 15:
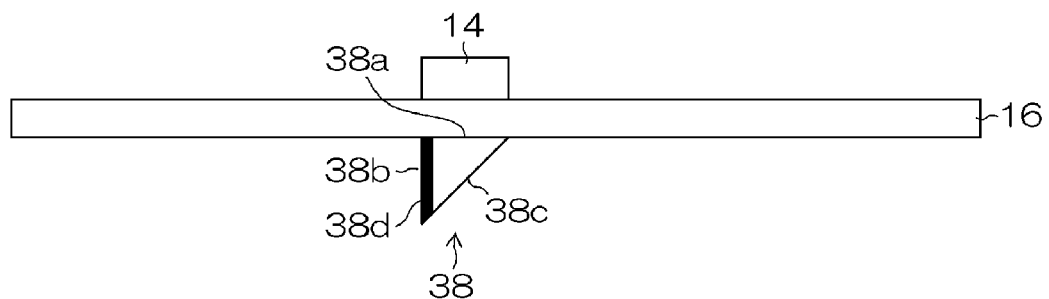
FIG. 15 is a schematic view illustrating the optical member that can be applied to the modified example of FIG. 14.

FIG. 15 shows the optical member 38 to be applied to the modified example of FIG. 14. The optical member 38 can have a triangular prism shape, as shown in FIG. 15. The optical member 38 can have a first face 38a and can be disposed on the mounting substrate 16 so that the first face 38a is brought into contact with the surface of the mounting substrate 16 opposite to the side where the semiconductor light emitting element 14 is mounted. Specifically, the optical member 38 can have a second face 38b perpendicular to the mounting substrate 16 and a third face 38c inclined relative to the mounting substrate 16, and can be disposed such that the second face 38a faces towards the projection lens 12 and the third face 38c faces towards the reflector 18. It should be noted that a reflection portion 38d can be provided on the inner side of the second face 38b toward the reflector 18. When light emitted from the second face of the semiconductor light emitting element 14 enters the optical member 38 via the first face 38a, the light can be reflected by the reflection portion 38d toward the third face 38c, and pass through the third face 38c to be directed to the reflector 18.

Accordingly, even when the lower side of the optical axis of the semiconductor light emitting element 14 tilts toward the projection lens 12, the light from the second face of the element 14 can be utilized effectively.

The present exemplary embodiment can appropriately utilize the semiconductor light source device shown in any of FIGS. 2A to 2C. The thus prepared configuration of the lighting device 10 of the present exemplary embodiment can provide the same or similar light distribution pattern as that shown in FIG. 4. The reflection portion 36 can impart a low beam light distribution pattern to light.

The presently disclosed subject matter is not limited to the above-described exemplary embodiments including the modified examples, but may be modified in various ways based on the above described techniques. In the above exemplary embodiments, the light emitted from the first and second faces of the semiconductor light emitting element can be utilized to form a light distribution pattern for a vehicle light. However, the presently disclosed subject matter can be applied to the formation of light distribution patterns used in an auxiliary light such as a day-time running lamp, a cornering lamp, and the like, an auxiliary headlight, such as a fog lamp, and the like, spot lamps, etc. These lamps can also be used in combination.

The lighting device and the semiconductor light source device of the presently disclosed subject matter can be advantageously applied to an illumination device that utilizes two or more different light distribution patterns other than a vehicle lighting device. Furthermore, a plurality of the lighting device of the presently disclosed subject matter can be used in a single apparatus to obtain a desired light distribution pattern.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light source device comprising:
a semiconductor light emitting element having a first face and a second face on an opposite side of the first face, the semiconductor light emitting element configured to emit light from the first face and the second face;
a mounting substrate located adjacent the semiconductor light emitting element such that light emitted from the second face is transmitted through the mounting substrate; and
a wavelength-conversion layer located adjacent at least one of the first face and the second face of the semiconductor light emitting element,
wherein the mounting substrate has a through hole at an area where the semiconductor light emitting element is mounted to the mounting substrate, and the wavelength-conversion layer is disposed within the through hole.

* * * * *